United States Patent [19]

Braginski

[11] 3,979,737

[45] Sept. 7, 1976

[54] BISTABLE MAGNETIC BUBBLE DOMAIN DEVICES

[75] Inventor: Aleksander I. Braginski, Pittsburgh, Pa.

[73] Assignee: Westinghouse Electric Corporation, Pittsburgh, Pa.

[22] Filed: Sept. 20, 1974

[21] Appl. No.: 508,003

[52] U.S. Cl. ............................................. 340/174 TF
[51] Int. Cl.² ................... G11C 11/14; G11C 11/42
[58] Field of Search .............................. 340/174 TF

[56] References Cited
UNITED STATES PATENTS

| 3,523,286 | 8/1970 | Bobeck et al. | 340/174 TF |
|---|---|---|---|
| 3,786,452 | 1/1974 | Guesic | 340/174 TF |
| 3,836,895 | 9/1974 | De Jonge | 340/174 TF |
| 3,866,190 | 2/1975 | De Jonge et al. | 340/174 TF |

Primary Examiner—Vincent P. Canney
Attorney, Agent, or Firm—C. L. Menzemer

[57] ABSTRACT

A magnetic film is incorporated in a device suitable for use with a computer; the film is capable of supporting magnetic bubble domains of two different sizes corresponding to stable hysteresis states which exist simultaneously under the same external magnetic field bias. When densely packed in an array, the bistable magnetic bubble domains form the basis for binary coded data storage. Single crystal garnet and amorphous intermetallic compounds may be employed as bistable bubble domain materials.

12 Claims, 7 Drawing Figures

BISTABLE MAGNETIC BUBBLE DOMAIN DEVICES

GOVERNMENT CONTRACT

This invention was made in the course of or under Government Contract F44620-72-C-0035.

BACKGROUND OF THE INVENTION

1. Field of the Invention

The present invention relates to binary coded magnetic devices such as computer memories and shift registers.

2. Description of the Prior Art

Magnetic bubble domain devices of the prior art typically represent binary information by means of the existence or lack of a bubble at a specific location and time. Such devices typically feature chips made of epitaxially grown rare-earth ferrimagnetic garnet layers overcoated with ferromagnetic film drive patterns. The ferromagnetic film drive patterns may be made of, for example, the nickel-iron alloy sold as Permalloy, or other suitable soft magnetic materials. The drive patterns generally provide means for generating, moving and annihilating magnetic bubbles in the adjacent garnet layer. Under the influence of a high frequency rotating magnetic field the magnetic bubbles move under the attraction and repulsion of the alternating magnetic poles induced in the drive patterns. Detection of a magnetic bubble may be achieved by a number of different techniques known to those skilled in the art, of which are Hall effect sensors, magnetoresistance sensors and magneto-optic sensors.

SUMMARY OF THE INVENTION

The present invention comprises a magnetic bubble domain memory device which stores binary coded information by means of two different size magnetically stable bubbles. A densely packed, hexagonal array of bistable bubbles contained in a suitable magnetic film may be coherently propagated through the film as a raft of binary information, repetitively passing write heads which are capable of selectively changing the state of individual bubbles and passing read heads which are capable of selectively sensing the state of the individual bubbles. The mutual repulsion of the bubbles is relied on to keep the hexagonal array or raft intact thereby eliminating the necessity for the complex drive patterns of the prior art.

DESCRIPTION OF THE PREFERRED EMBODIMENTS

Figure 1:
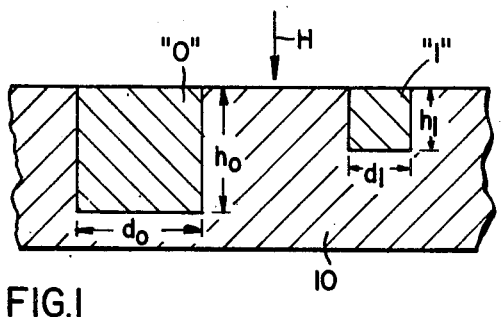
FIG. 1 is a greatly enlarged schematic cross-section of a film illustrating two different size magnetic bubble domains.

This invention follows the discovery that two stable bubble sizes can be generated and supported in epitaxial films, as disclosed by the inventor in November 1972 at the 18th Annual Conference on Magnetism and Magnetic Materials given by the American Institute of Physics. Further observations are reported by the inventor in Appl. Phys. Lett., Vol. 24, No. 1, 1 Jan. 1974. As illustrated in FIG. 1, the two different bubble sizes in a suitable film 10 may be controlled by introducing a sufficiently strong variation of domain wall energy and/or magnetization along the normal to the plane as indicated by the arrow with designation H. The respective bubbles are of generally cylindrical shape, having diameters and heights designated by $d_0$, $d_1$ and $h_0$, $h_1$ respectively, the subscripts corresponding to the binary representations "0" and "1". Observations indicate that $d_0$ is roughly twice that of $d_1$ and $h_0$ is roughly twice that of $h_1$.

Figure 2:
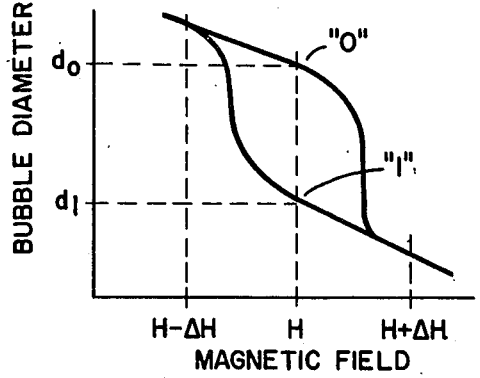
FIG. 2 is a graphic illustration of a transformation hysteresis loop.

In accordance with the present invention, there is disclosed the use of transformation hysteresis to store binary information in bistable magnetic bubble domains. The word "bistable" is used in this specification to mean "capable of existing in either of two magnetically stable states." Although novel in physical operation, the present invention embraces essentially the same theoretical principles of hysteresis phenomena employed in existing magnetic core memories. FIG. 2 graphically illustrates a transformation hysteresis loop. The binary representations 0 and 1 are labeled at their respective positions on the curves of FIG. 2 for each of the two stable states corresponding to the larger and smaller diameters of the bubbles shown in FIG. 1.

Figure 3:
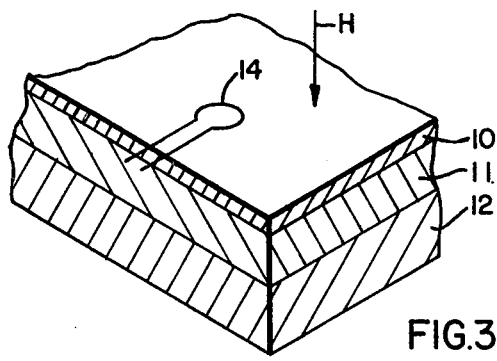
FIG. 3 is a greatly enlarged fragmentary cross-section of a memory device structure.

While other structures and materials may be employed, FIG. 3 illustrates an example of a structure which could produce the conditions suitable for supporting and using the bistable bubble phenomenon. A suitable film 10 is adjacent to a suitable substrate 11 which in turn is adjacent to a flat permanent magnet 12 which produces a nominal magnetic field bias represented by H in the direction of the arrow. A suitable substrate 11 would be, for example $Dy_{1.5}Gd_{1.5}Ga_5O_{12}$ and a suitable film 10 would be, for example, the garnet $Er_3Ga_{0.7}Fe_{4.3}O_{12}$ epitaxially grown on the substrate 11. A localized bias pulse $\pm\Delta H$ as shown in FIG. 2 can be superimposed on H by passing a current pulse through the conductor loop 14 of FIG. 3. This current will switch the bubble under the loop 14 to either the one or the zero state (1 or 0) depending on the sign of the current pulse. The experimentally established switching times are very short, being less than 40 nanoseconds. The switching back and forth between the two states is entirely reproducible, and the energies required for switching in either direction are approximately equal, thus providing a binary write mechanism. This is an improvement over the known "bubble-no bubble" binary representation which is less convenient since nucleation and annihilation of bubbles requires considerably higher energy.

The read-out of binary information can be achieved by one of many ways known and used at present. Suitable examples are magneto-optic and magnetoresistive sensing devices which may be designed to discriminate between the 0 and 1 state, or the large and small bubbles, thus providing a binary read mechanism.

Figure 4:
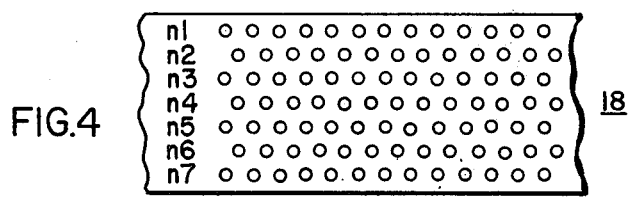
FIG. 4 is a greatly enlarged schematic plan view of a densely packed hexagonal array of magnetic bubble domains.
Figure 5:
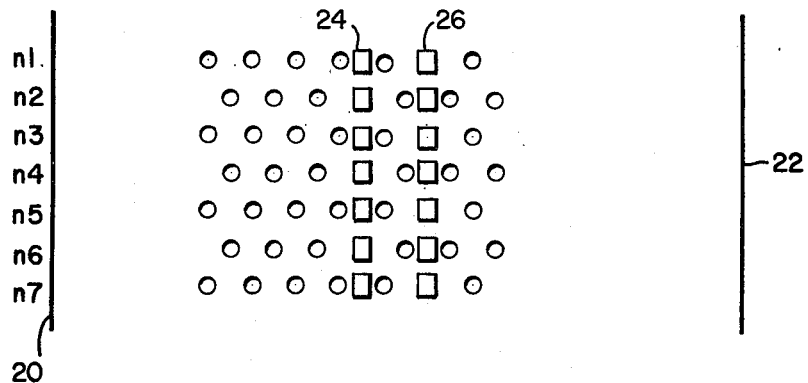
FIG. 5 is a greatly enlarged schematic plan view of a read-write system for use with a magnetic bubble domain array.

The bistable bubble thus provides a basis for a novel type of magnetic bubble domain memory device. It has all the advantages of existing bubble memories, including high bit density and high data rate, but is also simpler and better suited to replace traditional discs and drums. For example, a densely packed, hexagonal array of bistable bubbles may be propagated in an epitaxial garnet film in the form of a raft 18 as illustrated in FIG. 4. Each bubble in the hexagonal array has six nearest neighbors. The propagation may be achieved by a bubble stability affecting means known in the art, so that the raft 18 travels back and forth between two extreme boundaries 20 and 22 which provide an area at least twice that of the raft 18, as illustrated in FIG. 5. Two examples of suitable bubble stability affecting means are an oscillating magnetic field gradient and the use of Hall effect in an adjacent semiconductor layer. An advantage of this invention is that the raft 18 is ideally suited to the Hall effect propagation technique of U.S. Pat. No. 3,825,910; thereby eliminating the bulky and relatively expensive magnetic field generators commonly employed in magnetic bubble domain devices of the prior art. The array or raft 18 of bistable bubbles which can be used to store binary coded information, is held intact by the mutual repulsion of neighboring bubbles. Disposed adjacent to the film represented by the row of squares 24 are a series of write head mechanisms, such as the loop 14 of FIG. 3. Similarly, an adjacent row of squares 26 representing read mechanisms may be applied to the film, preferably of the magneto-optic variety. The designations $n1$ through $n7$ in FIGS. 4 and 5 illustrate, by way of example, seven rows of bistable bubbles. The number of rows and number of bubbles in each row will, in actual practice, depend upon a number of different design and application considerations, such as memory capacity and access time.

An important feature of this invention is the remarkable stability of the "write" magnetic field range. In a sample film of ErGaIG under a nominal magnetic field bias of 72 oersteds, the bubbles of the 1 state were stable up to 92 oersteds when collapse occurred, thus providing a stability range of nearly 20 oersteds. The bubbles of the 0 state were stable down to a zero bias field, as a result of the self-stabilizing properties of the densely packed hexagonal array.

Since the hexagonal bubble array is self-stabilizing to some extent, another advantage of such a memory is the elimination of support circuitry such as the ferromagnetic film drive patterns required in present bubble memory systems, examples of which are the so-called T-bar and chevron patterns. Thereby complex auxiliary structures previously required are eliminated. Stabilization of a hexagonal array of bubbles, as in FIGS. 4 or 5, is primarily achieved by mutual magnetostatic interaction; however, distortion of the array can result when blocks of bubbles within the array are mainly in one of the two stable states. Therefore, further stabilization is necessary so that the bubbles may be located with certainty in relationship to read and write heads. One stabilization method is the use of only alternate rows to carry information while adjacent dummy rows always remain in one of the stable states, for example, the larger state. Other possible stabilization techniques include the use of ion-milled grooves or tracks. However, a preferred stabilization technique is magnetostatic coupling, an embodiment of which is described below in more detail, and illustrated in FIG. 6.

A closely spaced auxiliary layer containing an array of bubbles in one stable state can be located immediately below the film containing the array of bistable bubbles, with the bubbles in the respective arrays disposed in vertical juxtaposition. By reason of this close vertical spacing, there is a magnetostatic coupling between pairs of bubbles, one from each array, that prevents distortion of the bistable bubble array as one or more bistable bubbles are switched from one hysteresis state to the other. This coupling phenomenon has been described in an article entitled, "Bubble Domains in Magnetostatically Coupled Garnet Films," Appl. Phys. Lett., Vol. 23, No. 8, 15 Oct. 1973.

Figure 6:
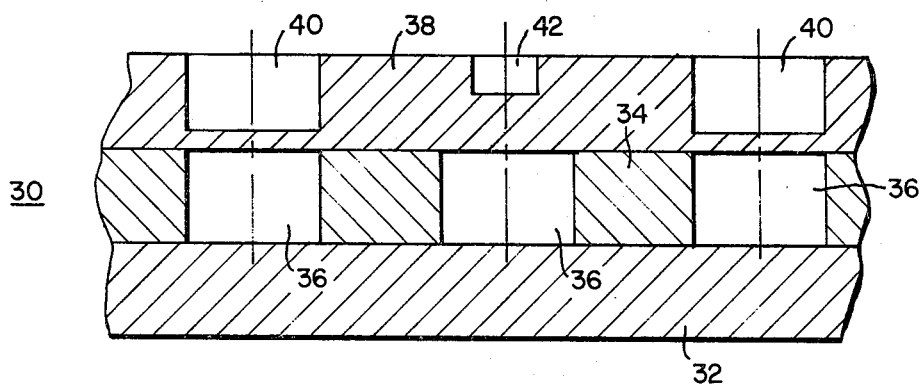
FIG. 6 is a greatly enlarged schematic cross-section of bubble domains in two adjacent films.

Referring to FIG. 6, there is illustrated a cross-section of such a stabilized system 30 comprising two separate bubble arrays. The system 30 comprises a suitable substrate 32 upon which is deposited an epitaxial garnet film 34 of appropriate composition in which a relatively stable array of only one size of bubble domain 36 is generated. Disposed directly upon film 34 is a second garnet film 38 of such composition that a bistable bubble array of both large bubbles 40 and smaller bubbles 42 can be generated. The axis of each bubble 40 or 42 is aligned with the axis of a bubble 36. Due to the mutual magnetostatic coupling of each bubble 36 with a superimposed bubble 40 or 42, the bubbles 40 or 42 will retain their spatial arrangement regardless of their being switched from one stable state to another, thus minimizing array distortion so that bubbles may be located with certainty.

Figure 7:
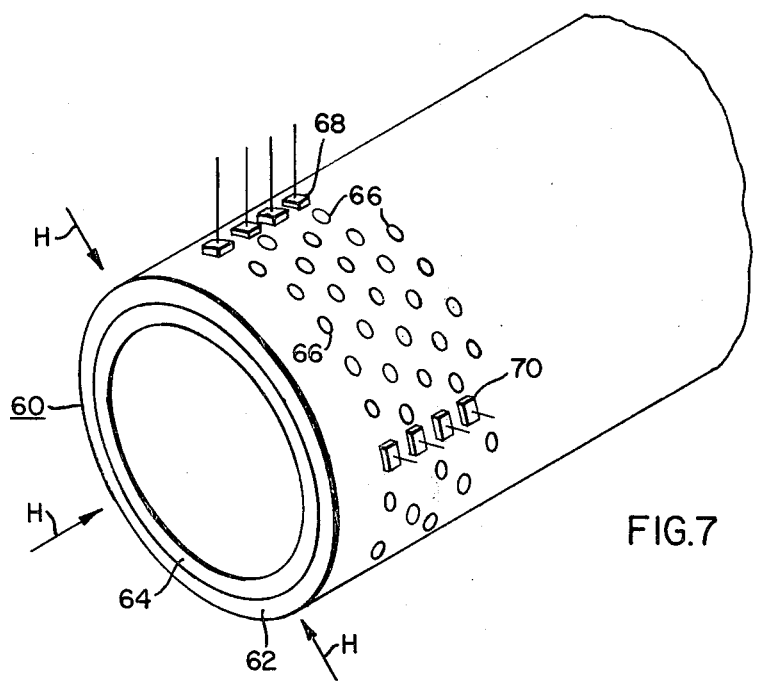
FIG. 7 is a greatly enlarged view in perspective of a cylindrical device arrangement.

A further extension of the traveling array concept is possible using a cylindrical layer of an amorphous intermetallic compound, known to those skilled in the art, such as gadolinium cobalt, which may support bistable bubbles. Referring to FIG. 7, there is shown a cylinder 60 comprising a suitable bistable bubble supporting layer 62 deposited on a suitable substrate 64. Rows 66 of an array of bistable bubbles are generated in the layer 62 forming closed loops around the periphery of the cylinder 60 in full analogy to the magnetic drums presently employed in computers. A radially applied magnetic bias field of circular symmetry is schematically represented by the letter H in the direction of the arrows. Suitable write heads 68 are disposed at one position along the cylinder surface, and suitable read heads 70 are disposed at another position. Drive means for rotating the array around the cylinder 60 (preferably Hall effect means not shown) can be employed to cause the array to pass at a suitable speed below the respective heads 68 and 70 so that information can be stored in, and retrieved from the bubble array.

As with magnetic drums of the prior art, stand-by power is not required; however, a memory system using the principles of the present invention has the advantage of operating without the moving parts necessary to rotate such drums or discs. Smaller size and reduced power consumption are further obvious advantages over magnetic drum and disc memory systems of the prior art.

Throughout the above description of the preferred embodiments, the cited magnetic bubble domain materials are merely illustrative of the many materials known to those skilled in the art. Other materials capable of exhibiting bistable bubble phenomena can be employed in practicing the present invention, which, when taken with the drawings, is seen to provide a novel binary representation and effective input/output technique in the form of a propagating, densely packed, hexagonal array of bistable magnetic bubble domains.

What is claimed is:

1. A device suitable for use in a computer memory or the like comprising a film capable of supporting a densely packed hexagonal array of bistable magnetic bubble domains, writing means for externally altering the state of the individual bubble domains, reading means for sensing and distinguishing the state of the bubble domains, magnetic bubble domain propagating means for repetitively passing the array in proximity to said reading and writing means.

2. The device of claim 1 wherein a magnetic field means is disposed adjacent to and in cooperation with said film.

3. The device of claim 1, wherein the film is an epitaxially deposited garnet film and an associated substrate underlies the garnet film.

4. The device of claim 1 wherein the film is in the shape of a circular cylinder and comprises an amorphous intermetallic compound.

5. The device of claim 1, wherein there is disposed below the film, a second film capable of supporting bubble domains of only one stable state in a selected array, and bistable bubbles may be disposed in the first recited film directly over the bubble array in the second film, whereby the second film bubbles stabilize the bistable bubble array.

6. A method of processing binary coded data comprising the steps:
   a. coherently propagating a densely packed hexagonal array of bistable magnetic bubble domains past read and write heads;
   b. writing binary coded data into the array by energizing write heads in proximity to selected bubble domains, and
   c. reading binary coded data from the array by sensing bubbles in proximity to the read heads.

7. A method of storing binary coded data in a body of bistable magnetic bubble domain supporting material, comprising the steps:
   a. energizing a write head,
   b. applying a magnetic bias to a bistable bubble,
   c. altering the stable state of the bubble, and
   d. repeating steps (a), (b), and (c) to produce a coherently propagatable densely packed hexagonal array of binary coded data.

8. A method of reading binary coded data from a body of magnetic bubble domain supporting material which contains said data in a densely packed hexagonal array of bistable bubbles, comprising the steps:
   a. coherently propagating the array of bubbles adjacent to associated sensing means;
   b. sensing the stable state of the bubble, and
   c. generating and transmitting an electrical pulse therefrom in accordance with the stable state of the bubble.

9. A device for storing binary coded data comprising at least one thin film, a hexagonal array of bistable magnetic bubble domains disposed in said thin film, writing means disposed adjacent to said thin film for selectively switching bubble domain stable states, reading means disposed adjacent to said thin film for discriminating between bubble domain stable states, and bubble stability affecting means for coherently propagating said hexagonal array through said thin film, whereby said reading and writing means interact with said bubble domains.

10. A device of claim 9 wherein said thin film comprises an epitaxially deposited garnet film having an area sufficiently large to permit said hexagonal array to oscillate whereby said bubble domains repetitively pass within operative proximity to said reading and writing means.

11. A device of claim 9 wherein said bubble stability affecting means comprises an oscillating magnetic field.

12. A device of claim 9 wherein said bubble stability affecting means comprises a semiconductor layer disposed adjacent to said thin film for producing a Hall effect in said thin film, whereby said hexagonal array may be coherently propagated through said film in response to said Hall effect producing means.

* * * * *